United States Patent
Yoshikawa

(10) Patent No.: US 12,125,684 B2
(45) Date of Patent: Oct. 22, 2024

(54) TEMPERATURE CONTROLLED REACTION CHAMBER

(71) Applicant: ASM IP Holding B.V., Almere (NL)

(72) Inventor: Jun Yoshikawa, Hachioji (JP)

(73) Assignee: ASM IP Holding B.V., Almere (NL)

( * ) Notice: Subject to any disclaimer, the term of this patent is extended or adjusted under 35 U.S.C. 154(b) by 301 days.

(21) Appl. No.: 17/697,725

(22) Filed: Mar. 17, 2022

(65) Prior Publication Data
US 2022/0301829 A1 Sep. 22, 2022

Related U.S. Application Data

(60) Provisional application No. 63/164,472, filed on Mar. 22, 2021.

(51) Int. Cl.
*H01J 37/32* (2006.01)

(52) U.S. Cl.
CPC .... *H01J 37/32522* (2013.01); *H01J 37/3244* (2013.01)

(58) Field of Classification Search
CPC ......... H01L 21/67126; H01L 21/67109; H01L 21/67103; H01L 21/6719; C23C 16/45565; C23C 16/52; C23C 16/4586; C23C 16/44; C23C 16/4411; H01J 37/32743; H01J 37/32724; H01J 37/3244; H01J 37/32522
See application file for complete search history.

(56) References Cited

U.S. PATENT DOCUMENTS

| | | | |
|---|---|---|---|
| 6,507,007 B2 | 1/2003 | Van Bilsen | |
| 8,933,375 B2 | 1/2015 | Dunn | |
| 9,299,595 B2 | 3/2016 | Dunn | |
| 9,653,267 B2 | 5/2017 | Carducci | |
| 10,415,899 B2 | 9/2019 | Tanabe | |
| 10,612,136 B2 | 4/2020 | Sreeram | |
| 10,643,826 B2 | 5/2020 | Kim | |
| 10,941,490 B2 | 3/2021 | Shugrue | |
| 11,168,395 B2 | 11/2021 | Sreeram | |
| 2015/0059981 A1* | 3/2015 | Huston | C23C 16/46 118/733 |
| 2015/0221482 A1* | 8/2015 | Yoshida | G01J 5/0044 374/1 |
| 2019/0003052 A1* | 1/2019 | Shero | C23C 16/45565 |
| 2021/0079527 A1 | 3/2021 | White | |
| 2022/0130645 A1* | 4/2022 | Kobune | H01J 37/32651 |
| 2022/0139736 A1* | 5/2022 | Cho | H01J 37/32724 118/725 |

* cited by examiner

*Primary Examiner* — Ana M Vazquez
(74) *Attorney, Agent, or Firm* — Snell & Wilmer L.L.P.

(57) ABSTRACT

Apparatuses for processing substrates with temperature controlled reaction chambers are provided. In some embodiments, an apparatus for processing a substrate includes a reaction chamber provided with a chamber wall; a gate valve provided to the wall; a substrate transfer chamber operationally connected to the gate valve; a substrate transfer robot disposed within the substrate transfer chamber for transferring the substrate between the reaction chamber and the substrate transfer chamber through the gate valve; a substrate support provided with a heater disposed within the reaction chamber; and a chiller provided to the wall opposite the gate valve.

19 Claims, 1 Drawing Sheet

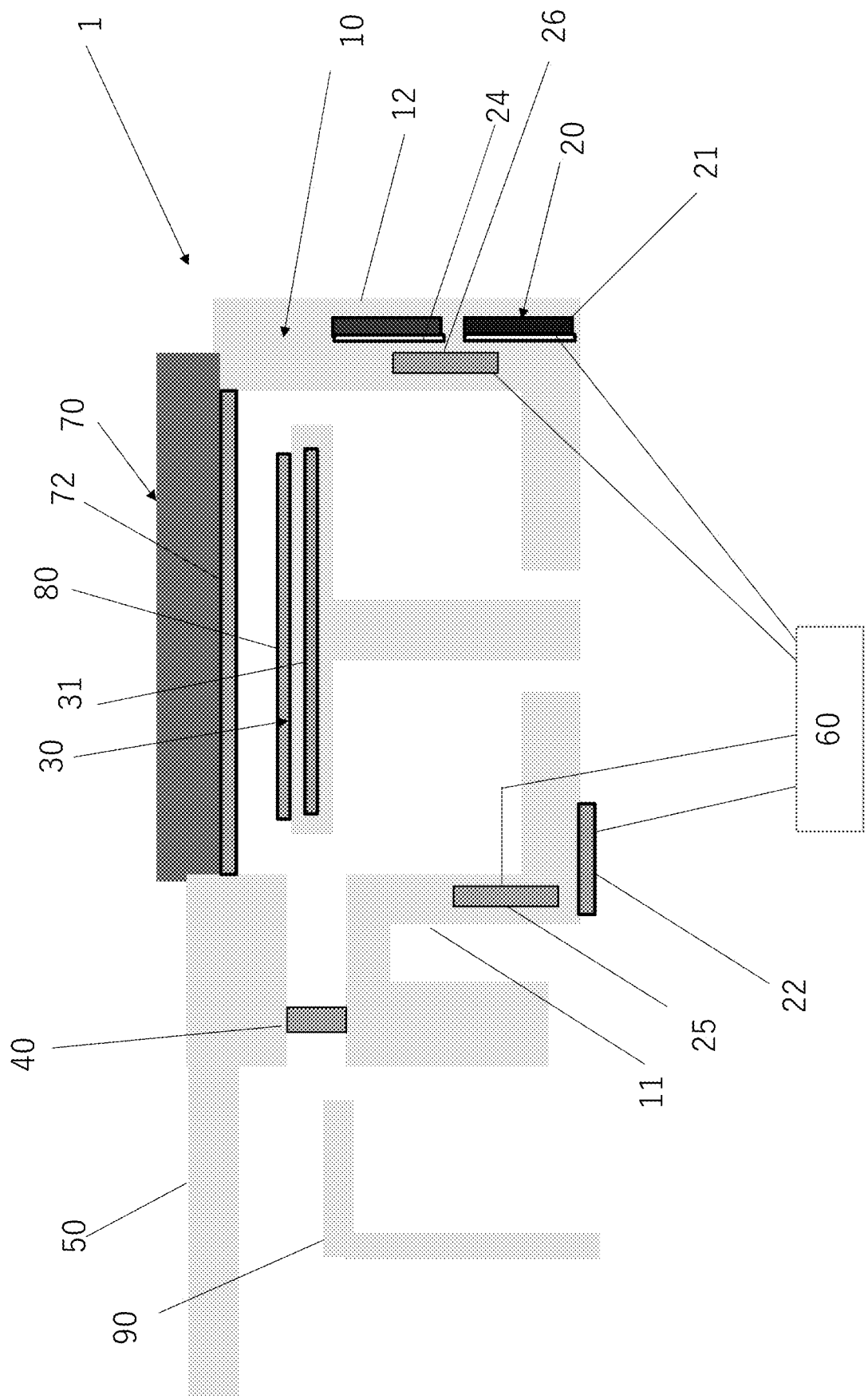

TEMPERATURE CONTROLLED REACTION CHAMBER

CROSS-REFERENCE TO RELATED APPLICATIONS

This application claims the benefit of U.S. Provisional Application No. 63/164,472, filed on Mar. 22, 2021, in the United States Patent and Trademark Office, the disclosure of which is incorporated herein in its entirety by reference.

FIELD OF INVENTION

The present disclosure relates generally to a substrate processing apparatus and particularly a temperature controlled reaction chamber, which facilitates a more uniform process across a surface within the reaction chamber, on a substrate.

BACKGROUND OF THE DISCLOSURE

Integrated circuits comprise multiple layers of materials deposited by various techniques, including Chemical Vapor Deposition (CVD), Atomic Layer Deposition (ALD), Plasma Enhanced CVD (PECVD), and Plasma Enhanced ALD (PEALD). As such, the deposition of materials on a semiconductor substrate is a critical step in the process of producing integrated circuits. It is important to perform uniform processing on the surface of the substrate, but the processing result often varies for various reasons, for example, temperature distribution, gate valve direction, and/or non-uniformity of electric field strength.

The main reason why the non-uniform temperature occurs is due to the presence of large heat flux toward the gate valve, which is connected to a wafer transfer chamber. As the result, the temperature of the chamber wall at the gate valve side always becomes lower than the temperature at the opposite side.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, an apparatus for processing a substrate is provided. The apparatus includes a reaction chamber provided with a chamber wall; a gate valve provided to the wall; a substrate transfer chamber operationally connected to the gate valve; a substrate transfer robot disposed within the substrate transfer chamber for transferring the substrate between the reaction chamber and the substrate transfer chamber through the gate valve; a substrate support provided with a heater disposed within the reaction chamber; and a chiller provided to the wall opposite the gate valve.

The chiller may be provided with a cooling channel. The apparatus may be constructed and/or arranged to provide a cooling fluid through the cooling channel. The cooling fluid may be a cooling liquid. The cooling liquid may comprise one of water and a perfluorpolyether through the cooling channel.

Alternatively, the cooling fluid may be a cooling gas. The cooling gas may comprise at least one of air, nitrogen, and inert gas through the channel.

In accordance with additional examples of the disclosure, the apparatus may further include an insulator disposed between the chiller and an inner surface of the wall.

In accordance with additional examples of the disclosure, the apparatus may further include a wall heater provided to the wall near the gate valve. The apparatus may further include an additional wall heater provided to the wall near the gate valve. The apparatus may further include a second wall heater provided to the wall opposite the gate valve.

In accordance with additional examples of the disclosure, the apparatus may further include a controller to control a temperature of the chiller and at least one of the wall heaters. The controller may be configured to control the temperature of a first part of the wall opposite the gate valve and the temperature of a part of the wall near the gate valve to the same value.

In accordance with additional examples of the disclosure, the apparatus may further comprise a gas supply unit constructed and arranged to face the substrate support. The gas supply unit may comprise a showerhead provided with a plurality of holes for supplying gas to the substrate.

These and other embodiments will become readily apparent to those skilled in the art from the following detailed description of certain embodiments having reference to the attached FIGURES; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative FIGURES.

FIG. 1 is a schematic diagram of an apparatus for processing a substrate.

It will be appreciated that elements in the FIGURES are illustrated for simplicity and clarity and have not necessarily been drawn to scale. For example, the dimensions of some of the elements in the FIGURES may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

In this disclosure, "gas" can refer to material that is a gas at normal temperature and pressure, a vaporized solid and/or a vaporized liquid, and may be constituted by a single gas or a mixture of gases, depending on the context. A gas other than a process gas, i.e., a gas introduced without passing through a gas supply unit, such as a showerhead, other gas distribution device, or the like, may be used for, e.g., sealing a reaction space, which includes a seal gas, such as a rare gas.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

Apparatus used for ALD, CVD, and/or the like, may be used for a variety of applications, including depositing and etching materials on a substrate surface. FIG. 1 is a schematic diagram of an apparatus 1 for processing a substrate 80. The apparatus 1 comprises a reaction chamber 10 provided with a chamber wall 11, 12; a gate valve 40 provided to the wall 11; a substrate transfer chamber 50 operationally connected to the gate valve 40; a substrate transfer robot 90 disposed within the substrate transfer chamber 50 for transferring a substrate 80 between the reaction chamber 10 and the substrate transfer chamber 50 through the gate valve 40; a substrate support 30 provided with a heater 31 disposed within the reaction chamber 10; and a chiller 20 provided to the wall 12 opposite the gate valve 40.

The apparatus 1 may have a gas supply unit 70 constructed and arranged to face the substrate support 30. The gas supply unit 70 may comprise a showerhead 72 provided with a plurality of holes for supplying gas to form a thin film on the substrate 80.

The chiller 20 may be provided with a cooling channel 21. The apparatus 1 may be constructed and/or arranged to provide a cooling fluid through the cooling channel 21. The cooling fluid may be a cooling liquid. The cooling liquid may comprise one of water and a perfluorpolyether through the cooling channel 21.

Alternatively, the apparatus 1 may be constructed and arranged to provide a cooling gas as a cooling fluid through the cooling channel 21. The cooling gas may comprise at least one of air, nitrogen, and inert gas through the channel 21.

The apparatus 1 may further comprise a space 24 disposed between the chiller 20 and an inner surface of the wall 12 to control the temperature more accurately. An insulator may be placed in the space 24.

The apparatus 1 may further comprise a wall heater 22 or strip heater provided to the wall 11 near the gate valve. The apparatus 1 may further comprise an additional wall heater 25 provided to the wall 11 near the gate valve 40. The apparatus 1 may further comprise a second wall heater 26 or cartridge heater provided to the wall 12 opposite the gate valve 40.

The apparatus 1 may further comprise a controller 60 to control a temperature of the chiller 20 and at least one of the wall heaters 22, 25, and 26. The controller 60 may be configured to control the temperature of a first part of the wall 11 opposite the gate valve 40 and the temperature of a part of the wall 12 near the gate valve 40 to the same value, resulting in improving process uniformity. By way of examples, a temperature (e.g., of a substrate or a substrate support) within a reaction chamber can be 500° C. to about 700° C.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. An apparatus for processing a substrate, comprising:
   a reaction chamber provided with a first wall and a second wall opposite the first wall, wherein the first wall comprises a passageway;
   a first wall heater disposed in the first wall;
   a gate valve provided in the passageway of the first wall;
   a substrate transfer chamber operationally connected to the gate valve;
   a substrate transfer robot disposed within the substrate transfer chamber for transferring the substrate between the reaction chamber and the substrate transfer chamber through the gate valve;
   a substrate support provided with a heater disposed within the reaction chamber; and
   a chiller provided to the second wall.

2. The apparatus of claim 1, wherein the chiller is provided with a cooling channel.

3. The apparatus of claim 2, wherein the apparatus is constructed and arranged to provide a cooling fluid through the cooling channel.

4. The apparatus of claim 3, wherein the apparatus is constructed and arranged to provide a cooling liquid as the cooling fluid through the cooling channel.

5. The apparatus of claim 4 wherein the apparatus is constructed and arranged to provide the cooling liquid comprising one of water and a perfluorpolyether through the cooling channel.

6. The apparatus of claim 3, wherein the apparatus is constructed and arranged to provide a cooling gas as the cooling fluid through the cooling channel.

7. The apparatus of claim 6, wherein the apparatus is constructed and arranged to provide the cooling gas comprising at least one of air, nitrogen, and inert gas through the cooling channel.

8. The apparatus of claim 1, further comprising a space disposed between the chiller and an inner surface of the second wall.

9. The apparatus of claim 8, wherein the space is in contact with the chiller and the inner surface of the second wall.

10. The apparatus of claims 1, further comprising a third wall disposed beneath the substrate processing chamber and spanning between the first wall and the second wall and a second wall heater provided to the third wall.

11. The apparatus of claim 10, further comprising a third wall heater provided to the second wall.

12. The apparatus of claim 11, further comprising a controller to control a temperature of the chiller and at least one of the wall heaters.

13. The apparatus of claim 12, wherein the controller is configured to control the temperature of a first part of the second wall and the temperature of a part of the first wall to the same temperature.

14. The apparatus of claim 13, further comprising an insulator disposed between the chiller and an inner surface of the second wall,
wherein the chiller is provided with a cooling channel.

15. The apparatus of claim 1, further comprising a gas supply unit constructed and arranged to face the substrate support and spanning between the first wall and the second wall.

16. The apparatus of claim 15, wherein the gas supply unit comprise a showerhead provided with a plurality of holes for supplying gas to the substrate.

17. The apparatus of claim 1, further comprising an insulator disposed between the chiller and an inner surface of the second wall.

18. The apparatus of claim 11, further comprising a controller to control a temperature of the chiller, the first wall heater, the second wall heater, and the third wall heater.

19. The apparatus of claim 1, further comprising a second cooling channel in the second wall.

* * * * *